United States Patent
Dey et al.

(10) Patent No.: US 9,071,265 B1
(45) Date of Patent: Jun. 30, 2015

(54) SUCCESSIVE APPROXIMATION ANALOG-TO-DIGITAL CONVERTER WITH LINEARITY ERROR CORRECTION

(71) Applicants: Sanjoy K. Dey, Noida (IN); Vikram Varma, Noida (IN)

(72) Inventors: Sanjoy K. Dey, Noida (IN); Vikram Varma, Noida (IN)

(73) Assignee: FREESCALE SEMICONDUCTOR, INC., Austin, TX (US)

( * ) Notice: Subject to any disclaimer, the term of this patent is extended or adjusted under 35 U.S.C. 154(b) by 0 days.

(21) Appl. No.: 14/457,124

(22) Filed: Aug. 12, 2014

(51) Int. Cl.
| | |
|---|---|
| H03M 1/10 | (2006.01) |
| H03M 1/14 | (2006.01) |
| H03M 1/12 | (2006.01) |
| H03M 1/80 | (2006.01) |
| H03M 1/06 | (2006.01) |
| H03M 1/00 | (2006.01) |
| H03M 7/16 | (2006.01) |

(52) U.S. Cl.
CPC .............. *H03M 1/144* (2013.01); *H03M 1/12* (2013.01); *H03M 1/804* (2013.01); *H03M 1/0695* (2013.01); *H03M 1/00* (2013.01); *H03M 7/165* (2013.01)

(58) Field of Classification Search
CPC ....... H03M 1/12; H03M 1/00; H03M 1/0695; H03M 7/165; H03M 1/804
USPC .......... 341/120, 172, 155, 156, 160, 161, 110
See application file for complete search history.

(56) References Cited

U.S. PATENT DOCUMENTS

| | | | |
|---|---|---|---|
| 4,348,658 | A | 9/1982 | Carter |
| 7,443,323 | B2 | 10/2008 | Rotchford et al. |
| 7,605,741 | B2 | 10/2009 | Hurrell |
| 7,868,796 | B2 | 1/2011 | Berens et al. |
| 7,880,650 | B2 | 2/2011 | Feddeler et al. |
| 8,223,044 | B2 | 7/2012 | Snedeker |
| 8,477,052 | B2 | 7/2013 | Dey et al. |
| 2013/0162454 | A1* | 6/2013 | Lin .............................. 341/120 |

OTHER PUBLICATIONS

Hester et al., "Fully Differential ADC with Rai-to-Rail Common-Mode Range and Nonlinear Capacitor Compensation", IEEE Journal of Solid State Circuits, vol. 25, No. 1, Feb. 1990.
Tewksbury, T.L., Hae-Seung Lee, Characterization, modeling, and minimization of transient threshold voltage shifts in MOSFETs, Solid-State Circuits, IEEE Journal, Mar. 1994, pp. 239-252, vol. 29, Issue: 3, IEEE.

* cited by examiner

*Primary Examiner* — Joseph Lauture
(74) *Attorney, Agent, or Firm* — Charles Bergere

(57) ABSTRACT

A SAR ADC includes capacitors, a comparator, and a SAR logic circuit. The capacitors include a first set of capacitors and an error-detection capacitor. The first set of capacitors generates a first set of voltage signals that are compared with a common-mode voltage signal ($V_{CM}$) by the comparator during a first set of comparison cycles. The comparator generates a first set of control signals that is used by the SAR logic circuit to successively approximate the first set of voltage signals and generate a first set of bits. An error-detection capacitor generates an error-detection signal that is compared with the common-mode voltage signal $V_{CM}$ by the comparator to generate an error-detection control signal. The SAR logic circuit compensate for an error in the first set of bits based the logic state of the error-detection control signal.

20 Claims, 3 Drawing Sheets

SUCCESSIVE APPROXIMATION ANALOG-TO-DIGITAL CONVERTER WITH LINEARITY ERROR CORRECTION

BACKGROUND OF THE INVENTION

The present invention relates generally to integrated circuits, and, more particularly, to a successive approximation register analog-to-digital converter.

Data converters including analog-to-digital converters (ADC) are commonly used in electronic devices like wireless communication systems, and audio and video systems. The ADCs can be of different types such as flash ADCs, pipelined ADCs, successive approximation register (SAR) ADCs, etc. An n-bit SAR ADC uses a binary search algorithm to convert a continuous analog input signal to an n-bit digital signal. For example, a 10-bit SAR ADC converts an analog input signal into a corresponding 10-bit digital signal. The SAR ADC performs repetitive comparisons of the analog input signal with a sequence of known binary-weighted values to estimate the binary value of the digital signal.

A SAR ADC includes a DAC, a differential comparator, and a SAR register. The SAR register is connected between the DAC and the comparator in a feedback loop. The DAC includes a plurality of binary-weighted circuit elements such as capacitors and resistors. In the above example, the 10-bit SAR ADC has a 10-bit DAC that has ten binary-weighted capacitors for generating the 10-bit digital signal. Each binary-weighted capacitor corresponds to a binary digit of the 10-bit digital signal. The SAR ADC performs the analog-to-digital conversion over two phases, a sample phase and a compare phase. During the sample phase, the SAR ADC samples the analog input signal and generates a sampled analog input signal. During the compare phase, the binary-weighted circuit elements successively approximate the sampled analog input signal by comparing the sampled analog input signal with a series of comparison voltages that correspond to a series of binary values. A first comparison voltage corresponds to a binary value with the most significant bit (MSB) as binary one and the subsequent binary digits as zeros. If the differential comparator determines that the sampled analog input signal is greater than the first comparison voltage in a first comparison cycle (in the compare phase), then an MSB of the digital signal corresponding to the sampled analog input signal is set as binary one and stored in the SAR register; and if the comparator determines that the sampled analog input signal is less than the first comparison voltage, then the MSB is set as zero and stored in the SAR register. A second comparison voltage corresponds to a binary value with the MSB set to binary one or zero based on the first comparison cycle, the binary digit subsequent to the MSB (referred to as a next MSB) set as binary one and the subsequent binary digits set as binary zero. Hence, in each cycle of comparison, a successive comparison voltage of the series of comparison voltages is either half of the preceding comparison voltage or a sum of or difference between half of the preceding comparison voltage and half of a successive voltage range. This process is repeated to determine each binary digit of the digital signal. At the end of the compare phase, the binary values stored in the SAR register represent the digital signal that corresponds to the analog input signal.

SAR ADCs are susceptible to manufacturing defects, such as incorrect capacitance and resistance values of the binary-weighted circuit elements, a defective differential comparator, and so forth, which can lead to generation of an erroneous digital signal. The accuracy of the SAR ADC largely depends on error-free operation of the differential comparator. In order to operate with analog input signals having high voltage levels, the differential comparator includes metal-oxide semiconductor field-effect-transistors (MOSFETs) having stacked gate-oxide layers. The stacking of the gate-oxide layers is done at a nitrous oxide ($N_2O$) annealing stage during fabrication of the differential comparator. However, during the $N_2O$ annealing stage some traps or gaps may be formed in the gate-oxide layers due to surrounding impurities. When such MOSFETs are subjected to high gate-to-source voltages ($V_{GS}$) for time intervals in units of microseconds, a transient shift in threshold voltages of the MOSFETs occurs as electrons get trapped in the gaps formed in the gate-oxide layers of the MOSFETs due to development of a high electric field in the gate-oxide layers. Over longer time periods, the high electric field effect diminishes and the transient shift in the threshold voltages disappears, thereby restoring the actual threshold voltages. However, a dynamic offset voltage exists in the differential comparator due to this transient shift in the threshold voltages. The dynamic offset voltage may typically occur during the successive approximation steps of the SAR ADC and cause errors, such as differential-nonlinearity (DNL) spikes and missing binary values.

Therefore, it would be advantageous to have a SAR ADC that is not susceptible to errors caused by DNL spikes and missing binary values.

BRIEF DESCRIPTION OF THE DRAWINGS

The following detailed description of the preferred embodiments of the present invention will be better understood when read in conjunction with the appended drawings. The present invention is illustrated by way of example, and not limited by the accompanying figures, in which like references indicate similar elements.

DETAILED DESCRIPTION OF THE INVENTION

Figure 1:
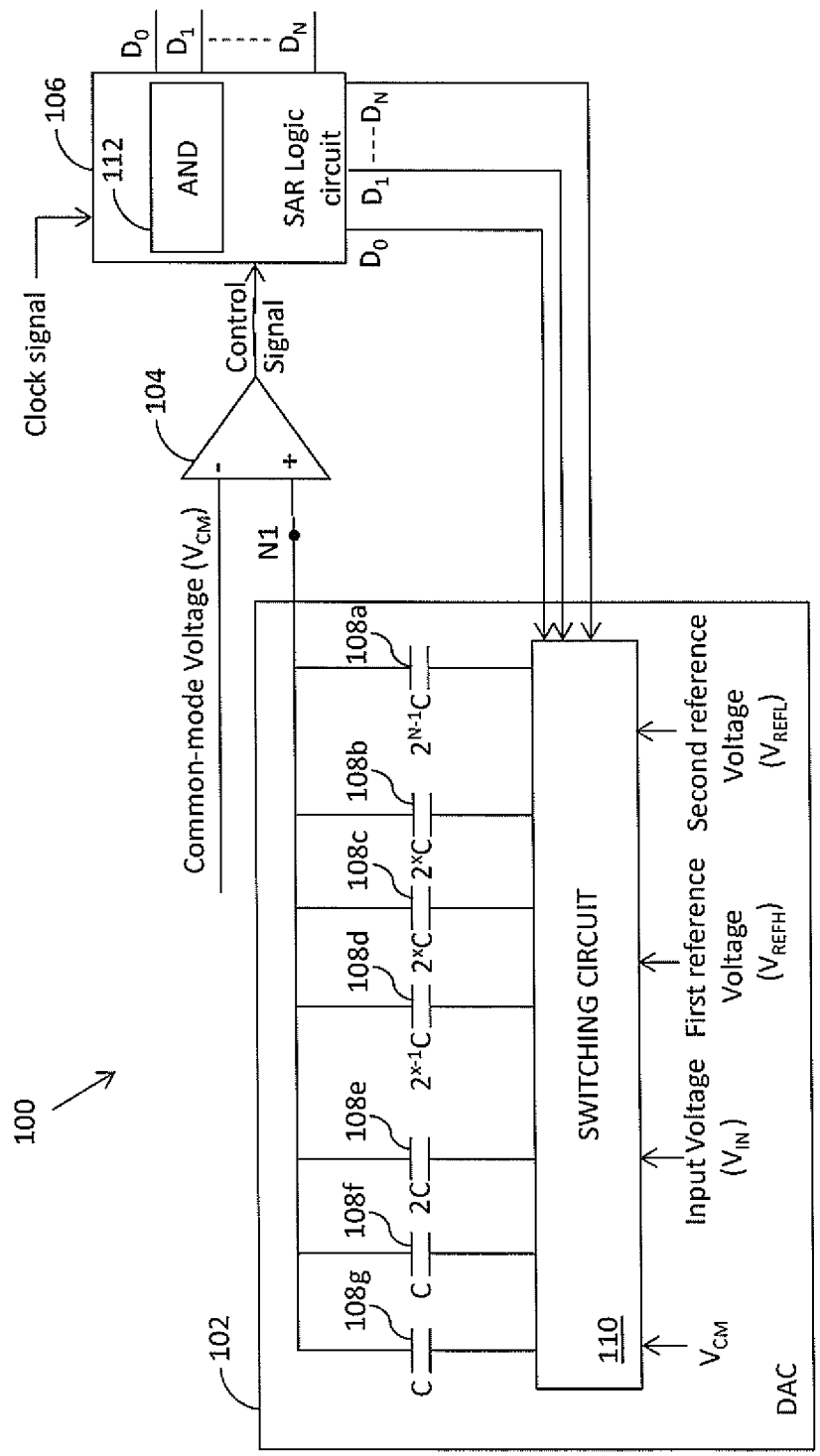
FIG. 1 is a schematic block diagram of a successive approximation register analog-to-digital converter (SAR ADC), in accordance with an embodiment of the present invention.

The detailed description of the appended drawings is intended as a description of the currently preferred embodiments of the present invention, and is not intended to represent the only form in which the present invention may be practiced. It is to be understood that the same or equivalent functions may be accomplished by different embodiments that are intended to be encompassed within the spirit and scope of the present invention.

In an embodiment of the present invention an analog-to-digital converter (ADC), comprising a plurality of capacitors, a comparator, and a successive-approximation-register (SAR) logic circuit, is provided. The capacitors have corresponding first terminals for receiving an analog input signal during a sampling cycle of an analog-to-digital conversion cycle of the ADC, and corresponding second terminals connected together at a first node. The capacitors comprise a first set of capacitors that generate a corresponding first set of voltage signals at the first node during a corresponding first set of comparison cycles of a plurality of comparison cycles of the analog-to-digital conversion cycle, an error-detection capacitor that generates an error-detection voltage signal at the first node during an error-detection comparison cycle of the plurality of comparison cycles, and a second set of capacitors that generate a corresponding second set of voltage signals at the first node during corresponding second set of comparison cycles of the plurality of comparison cycles. The comparator has a first input terminal connected to the first node for receiving the first set of voltage signals at the end of corresponding first set of comparison cycles, the second set of voltage signals at the end of corresponding second set of comparison cycles, and the error-detection voltage signal at the end of the error-detection comparison cycle. The comparator a second input terminal for receiving a common-mode voltage signal. The comparator has an output terminal for outputting a first set of control signals at the end of corresponding first set of comparison cycles, an error-detection control signal at the end of the error-detection comparison cycle, and a second set of control signals at the end of corresponding second set of comparison cycles. The SAR logic circuit is connected to the output terminal of the comparator. The SAR logic circuit generates a first set of bits corresponding to the first set of voltage signals by running a first successive approximation using the first set of control signals at the end of corresponding first set of comparison cycles. The SAR logic circuit compensates for an error in the first set of bits based on the error-detection control signal at the end of the error-detection comparison cycle. The SAR logic circuit generates a second set of bits corresponding to the second set of voltage signals by running a second successive approximation using the second set of control signals at the end of corresponding second set of comparison cycles. The first and second sets of bits correspond to a binary representation of the analog input signal.

In another embodiment of the present invention, a method for compensating for an error during an analog-to-digital conversion cycle of an analog-to-digital converter (ADC) is provided. The ADC receives an analog input signal and generates a corresponding binary representation. The ADC includes a plurality of capacitors, a comparator, and a successive-approximation-register (SAR) logic circuit. The capacitors include first and second sets of capacitors and an error-detection capacitor. The method includes sampling the analog input signal across the plurality of capacitors during a sampling cycle of the analog-to-digital conversion cycle. A first set of voltage signals is generated by a corresponding first set of capacitors during a corresponding first set of comparison cycles of a plurality of comparison cycles of the analog-to-digital conversion cycle. A first set of control signals is generated by the comparator based on a comparison between the first set of voltage signals and a common-mode voltage signal. A first set of bits corresponding to the first set of voltage signals is generated by the SAR logic circuit by running a first successive approximation using the first set of control signals. An error-detection voltage signal is generated by the error-detection capacitor during an error-detection comparison cycle of the plurality of comparison cycles. An error-detection control signal is generated by the comparator based on a comparison between the error-detection voltage signal and the common-mode voltage signal. An error in the first set of bits is compensated for by the SAR logic circuit based on the error-detection control signal. A second set of voltage signals is generated by corresponding second set of capacitors during corresponding second set of comparison cycles of the plurality of comparison cycles. A second set of control signals is generated by the comparator based on a comparison between the second set of voltage signals and the common-mode voltage signal. A second set of bits corresponding to the second set of voltage signals is generated by the SAR logic circuit by running a second successive approximation using the second set of control signals. The first and second sets of bits correspond to the binary representation of the analog input signal.

In yet another embodiment of the present invention, an analog-to-digital converter (ADC), comprising a plurality of capacitors, a comparator, a successive-approximation-register (SAR) logic circuit, and an AND gate, is provided. The capacitors have corresponding first terminals for receiving an analog input signal during a sampling cycle of an analog-to-digital conversion cycle of the ADC, and corresponding second terminals connected together to a first node. The capacitors comprise a first set of capacitors that generate corresponding first set of voltage signals at the first node during corresponding first set of comparison cycles of a plurality of comparison cycles of the analog-to-digital conversion cycle, an error-detection capacitor that generates an error-detection voltage signal at the first node during an error-detection comparison cycle of the plurality of comparison cycles, and a second set of capacitors that generate corresponding second set of voltage signals at the first node during corresponding second set of comparison cycles of the plurality of comparison cycles. The comparator has a first input terminal connected to the first node for receiving the first set of voltage signals at the end of corresponding first set of comparison cycles, the second set of voltage signals at the end of corresponding second set of comparison cycles, and the error-detection voltage signal at the end of the error-detection comparison cycle. The comparator a second input terminal for receiving a common-mode voltage signal. The comparator has an output terminal for outputting a first set of control signals at the end of corresponding first set of comparison cycles, an error-detection control signal at the end of the error-detection comparison cycle, and a second set of control signals at the end of corresponding second set of comparison cycles. The SAR logic circuit is connected to the output terminal of the comparator. The SRA logic circuit generates a first set of bits corresponding to the first set of voltage signals by running a first successive approximation using the first set of control signals at the end of corresponding first set of comparison cycles. The SAR logic circuit compensates for an error in the first set of bits based on the error-detection control signal at the end of the error-detection comparison cycle. The SAR logic circuit generates a second set of bits corresponding to the second set of voltage signals by running a second successive approximation using the second set of control signals at the end of corresponding second set of comparison cycles. The first and second sets of bits correspond to a binary representation of the analog input signal. The AND gate is connected to the SAR logic circuit for receiving the first set of bits and generating a first logic signal at the end of the first set of comparison cycles, such that the SAR logic circuit compensates for an error in the first set of bits based on the first logic signal.

Various embodiments of the present invention provide an analog-to-digital converter (ADC) that includes a plurality of capacitors, a comparator, and a successive-approximation-register (SAR) logic circuit. The plurality of capacitors includes a first set of capacitors, an error-detection capacitor, and a second set of capacitors. An analog input signal is sampled across the plurality of capacitors during a sampling cycle of an analog-to-digital conversion cycle of the ADC. The first set of capacitors generate a first set of voltage signals during corresponding first set of comparison cycles of a plurality of comparison cycles of the analog-to-digital conversion cycle of the ADC. The comparator compares the first set of voltage signals with a common-mode voltage signal and generates a first set of control signals at the end of corresponding first set of comparison cycles. The SAR logic circuit generates a first set of bits corresponding to the first set of voltage signals by running a first successive approximation using the first set of control signals at the end of corresponding first set of comparison cycles. The error-detection capacitor generates an error-detection voltage signal during an error-detection comparison cycle of the plurality of comparison cycles. The comparator compares the error-detection comparison voltage signal with the common-mode voltage signal and generates an error-detection control signal.

When at least one bit of the first set of bits is a binary zero, the SAR logic circuit compensates for an error in the first set of bits that has occurred due to the presence of a dynamic offset voltage in the comparator. If the error-detection control signal is high (at a logic high state) then the SAR logic circuit compensates for an error in the first set of bits by subtracting a binary one therefrom. However, if the error-detection control signal is at low then the SAR logic circuit outputs the first set of bits at the end of the error-detection control signal. The second set of capacitors generates a second set of voltage signals during corresponding second set of comparison cycles of the plurality of comparison cycles. The comparator compares the second set of voltage signals with the common-mode voltage signal and generates a second set of control signals at the end of corresponding second set of comparison cycles. The SAR logic circuit generates a second set of bits corresponding to the second set of voltage signals by running a second successive approximation using the second set of control signals at the end of corresponding second set of comparison cycles. The compensated first set of bits and the second set of bits represent a digital representation of the analog input signal.

A position of the error-detection capacitor among the plurality of capacitors is determined based on size of the SAR ADC and also a time period for which the dynamic offset voltage of the comparator exists. Since the dynamic offset voltage is transient, the error-detection comparison cycle is executed by the ADC when the dynamic offset voltage of the comparator disappears. Hence, as opposed to conventional ADCs, the ADC of the present invention compensates the error during successive approximation steps of the analog input signal thereby eliminating differential-nonlinearity (DNL) spikes and missing codes from the digital representation of the analog input signal. The ADC of the present invention further improves linearity of the digital representation of the analog input signal without requiring additional design changes, thereby reducing cost and area overheads.

Referring now to FIG. 1, a schematic block diagram of a SAR ADC 100 in accordance with an embodiment of the present invention is shown. The SAR ADC 100 may be an n-bit SAR ADC that receives an analog input signal and generates a corresponding n-bit digital signal, where n is any integer. In an embodiment of the present invention, the SAR ADC 100 is a 5-bit SAR ADC and includes a 5-bit digital-to-analog converter (DAC) 102, a comparator 104, and an SAR logic circuit 106. The DAC 102 includes binary-weighted first through seventh capacitors 108a-108g with capacitances equal to $2^4C$ ($2^{N-1}C$), $2^3C$ ($2^XC$), $2^3C$ ($2^XC$), $2^2C$ ($2^{X-1}C$), 2C, C, and C, respectively, and a switching circuit 110. The SAR logic circuit 106 includes an AND logic circuit 112. The first and second capacitors 108a and 108b form a first set of capacitors and the fourth through seventh capacitors 108d-108g form a second set of capacitors. The third capacitor 108c is an error-detection capacitor. The first and sixth capacitors 108a and 108f represent a most significant bit (MSB) and a least significant bit (LSB), respectively, of the 5-bit digital signal. The seventh capacitor 108g is a dummy capacitor. A first terminal of the first through seventh capacitors 108a-108g is connected to at least one of an analog input source (not shown), first and second reference voltage sources (not shown), and a common-mode voltage source (not shown) by way of the switching circuit 110 to receive a common-mode voltage signal (hereinafter referred to as $V_{CM}$), first and second reference voltage signals (hereinafter referred to as $V_{REFH}$ and $V_{REFL}$, respectively), and the analog input signal (hereinafter referred to as $V_{IN}$), respectively. A second terminal of the first through seventh capacitors 108a-108g is connected to a first node of the comparator 104 and to the switching circuit 110 by way of a switch (not shown). In an embodiment of the present invention, the $V_{REFH}$ is an internal reference voltage signal of the SAR ADC 100, the $V_{REFL}$ is ground voltage, the analog input signal ($V_{IN}$) is an analog input voltage signal, and the analog input source is an analog input voltage source.

The comparator 104 has a first input terminal that receives the $V_{CM}$, a second input terminal connected to the first node for receiving voltage signals corresponding to the first through seventh capacitors 108a-108g, and an output terminal for generating control signals based on a comparison between the voltage signals and the $V_{CM}$. In an embodiment of the present invention, the comparator 104 is a differential comparator. The SAR logic circuit 106 is connected to the output terminal of the comparator 104 for receiving the control signals corresponding to the first through seventh capacitors 108a-108g. The SAR logic circuit 106 successively approximates the voltage signals by using corresponding control signals and outputs corresponding bits. The switching circuit 110 is connected to the SAR logic circuit 106 for receiving the bits. It will be appreciated by those of skill in the art, that the error-detection capacitor may take a position of any of the first through seventh capacitors 108a-108g other than the third capacitor 108c.

In operation, an analog-to-digital conversion cycle of the SAR ADC 100 includes a discharge cycle, a sample cycle, a hold cycle, and comparison cycles. During the discharge cycle the first and second terminals of the first through seventh capacitors 108a-108g are connected to the common-mode voltage source by way of the switching circuit 110 for receiving the $V_{CM}$ As a result, the first through seventh capacitors 108a-108g are discharged due to zero voltage thereacross. The discharge cycle is followed by the sampling cycle. During the sampling cycle, the first terminals of the first through seventh capacitors 108a-108g are connected to the analog input source by way of the switching circuit 110 for receiving the $V_{IN}$. The second terminals of the first through seventh capacitors 108a-108g are connected to the switching circuit 110 by way of the switch for receiving the $V_{CM}$ Hence, the $V_{IN}$ is sampled across the first through seventh capacitors 108a-108g during the sampling cycle to generate a sampled $V_{IN}$. The sampling cycle is followed by the hold cycle (also referred to as charge transfer cycle), during which the first terminals of the first through seventh capacitors 108a-108g are connected to the common-mode voltage source by way of the switching circuit 110 for receiving the $V_{CM}$ and the second terminals thereof are disconnected from the switching circuit 110. Hence, during the hold cycle, charge corresponding to the sampled $V_{IN}$ is stored across the first through seventh capacitors 108a-108g.

The hold cycle is followed by the comparison cycles (also referred to as charge redistribution cycles). During a first comparison cycle, a first terminal of the first capacitor 108a is connected to the first reference voltage source by way of the switching circuit 110 for receiving the $V_{REFH}$. The first terminals of the second through seventh capacitors 108b-108g are connected to the second reference voltage source by way of the switching circuit 110 for receiving the $V_{REFL}$. The second terminals of the first through seventh capacitors 108a-108g are connected to the first node. Hence, during the first comparison cycle, magnitude of a first voltage signal corresponding to the first capacitor 108a equals ($V_{CM}-V_{IN}+V_{REFH}/2$). The first node receives the first voltage signal. The second input terminal of the comparator 104 receives the first voltage signal from the first node at the end of the first comparison cycle and generates a first control signal at the output terminal thereof based on a comparison between the first voltage signal and the $V_{CM}$.

When the magnitude of first voltage signal becomes greater than $V_{CM}$ (i.e., ($V_{CM}-V_{IN}+V_{REFH}/2$)>$V_{CM}$), the first control signal is generated at logic high state indicating that the magnitude of sampled $V_{IN}$ is less than half of $V_{REFH}$ (i.e. $V_{IN}<V_{REFH}/2$). The SAR logic circuit 106 includes an inverter (not shown) that receives the logic high first control signal and generates an inverted first control signal at logic low state. The SAR logic circuit 106 uses a sequential finite state machine (FSM) to successively approximate the first voltage signal by using the inverted first control signal and generates a first binary bit that corresponds to the MSB as binary zero. Hence, the 5-bit binary value corresponding to the first voltage signal is set as binary zero, i.e., $D_5, D_4, \ldots D_1, D_0$ are binary zeroes. When the switching circuit 110 receives the 5-bits of the binary value with the MSB as binary zero from the SAR logic circuit 106, the first terminal of the first capacitor 108a that corresponds to the MSB of the binary value is connected to the second reference voltage source by way of the switching circuit 110 for receiving the $V_{REFL}$.

When the magnitude of first voltage signal is less than $V_{CM}$ (i.e. ($V_{CM}-V_{IN}+V_{REFH}/2$)<$V_{CM}$), the first control signal is generated at logic low state indicating that the magnitude of sampled $V_{IN}$ is greater the than half of $V_{REFH}$ (i.e. $V_{IN}>V_{REFH}/2$). The inverter of the SAR logic circuit 106 receives the logic low first control signal and generates the inverted first control signal at logic high state. The SAR logic circuit 106 uses the FSM to successively approximate the first voltage signal by using the inverted first control signal and generates the first binary bit that corresponds to the MSB as binary one. Hence, the MSB of the binary value is set as binary one and the subsequent 4 (n−1) bits of the binary value are set as binary zeroes, i.e., $D_5, D_4, \ldots D_1, D_0$ is equal to 10 . . . 00. When the switching circuit 110 receives the 5-bits of the binary value with the MSB as binary one from the SAR logic circuit 106, the first terminal of the first capacitor 108a that corresponds to the MSB of the binary value stays connected to the first reference voltage source by way of the switching circuit 110 for receiving the $V_{REFH}$.

During a second comparison cycle, a first terminal of the second capacitor 108b is connected to the first reference voltage source by way of the switching circuit 110 for receiving the $V_{REFH}$. The first terminal of the first capacitor 108a remains connected to at least one of the first and second reference voltage sources based on the MSB of the binary value determined during the first comparison cycle. The first terminals of the third through seventh capacitors 108c-108g are connected to the second reference voltage source by way of the switching circuit 110 for receiving the $V_{REFL}$. Hence, during the second comparison cycle, magnitude of a second voltage signal corresponding to the second capacitor 108b equals ($V_{CM}-V_{IN}+3V_{REFH}/4$) when the MSB is set as binary one and ($V_{CM}-V_{IN}+V_{REFH}/4$) when the MSB is set as binary zero. The first node receives the second voltage signal. The second input terminal of the comparator 104 receives the second voltage signal from the first node at the end of the second comparison cycle and generates a second control signal at the output terminal thereof based on a comparison between the second voltage signal and the $V_{CM}$. The SAR logic circuit 106 uses the FSM to successively approximate the second voltage signal to generate a binary bit corresponding to a subsequent binary bit to the MSB (hereinafter referred to as a next MSB) of the binary value based on a logic state of the second control signal. Therefore, the first set of capacitors (108a and 108b) generates a first set of voltage signals (first and second voltage signals) at the first node during a corresponding first set of comparison cycles (first and second comparison cycles).

The first set of comparison cycles is followed by an error-detection comparison cycle. During the error-detection comparison cycle, a first terminal of the error-detection capacitor 108c is connected to the second reference voltage source by way of the switching circuit 110 for receiving the $V_{REFL}$. The first terminals of the first and second capacitors 108a and 108b stay connected to at least one of the first and second reference voltage sources by way of the switching circuit 110 based on the MSB and the next MSB of the binary value determined during the first and second comparison cycles, respectively. The first terminals of the fourth through seventh capacitors 108d-108g are connected to the second reference voltage source by way of the switching circuit 110 for receiving the $V_{REFL}$. Hence, during the error-detection comparison cycle, magnitude of an error-detection voltage signal corresponding to the error-detection capacitor 108c equals ($V_{CM}-V_{IN}+3V_{REFH}/4$) when both the MSB and the next MSB of the binary value are binary one, ($V_{CM}-V_{IN}+V_{REFH}/2$) when the MSB and the next MSB of the binary value are binary one and binary zero, respectively, and ($V_{CM}-V_{IN}+V_{REFH}/4$) when the MSB and the next MSB of the binary value are binary zero and binary one, respectively. The first node receives the error-detection voltage signal. The second input terminal of the comparator 104 receives the error-detection voltage signal from the first node at the end of the error-detection comparison cycle and generates an error-detection control signal at the output terminal thereof based on a comparison between the error-detection voltage signal and the $V_{CM}$.

When magnitude of the error-detection voltage signal is greater than $V_{CM}$, the comparator 104 generates the error-detection control signal at logic high state. The AND logic circuit 112 that represents an error-detection state of the FSM of the SAR logic circuit 106, receives the first set of bits from the SAR logic circuit 106 and generates a first logic signal. The first logic signal is at logic low state when at least one binary bit of the first set of bits is binary zero, i.e., a first terminal of at least one of the first and second capacitors 108a and 108b is connected to the second reference voltage source by way of the switching circuit 110 for receiving the $V_{REFL}$. When the first logic signal is at logic low state and the error-detection control signal is at logic high state, the FSM detects an error in the successive approximation of the first set of voltage signals. The error in the successive approximation of the first set of voltage signals causes an error in the first set of bits. This error occurs due to the presence of a dynamic offset voltage in the comparator 104 that comprises multiple metal-oxide-semiconductor field-effect-transistors (MOSFETs). A transient shift in threshold voltages of the MOSFETs results in the dynamic offset voltage in the comparator 104. Over longer time periods, the transient shift in the threshold voltages of the MOSFETs disappear thereby restoring original threshold voltages of the MOSFETs. Hence, a position of the error-detection capacitor 108c in the DAC 102 is determined based on a time period for which the dynamic offset voltage persists in the comparator 104. The error-detection comparison cycle is timed to occur when the transient shift in the threshold voltages of the MOSFETs disappears, thereby eliminating the effect of the dynamic offset voltage of the comparator 104. The SAR logic circuit 106 compensates the error in the first set of bits by subtracting binary one therefrom.

When magnitude of the error-detection voltage signal is less than $V_{CM}$, the comparator 104 generates the error-detection control signal at logic low state. When the first logic signal and the error-detection control signal are at logic low states, the FSM detects no error in the successive approximation of the first set of voltage signals. The SAR logic circuit 106 regenerates the first set of bits at the end of the error-detection comparison cycle.

The error-detection comparison cycle is followed by a second set of comparison cycles. A second set of voltage signals corresponding to the second set of capacitors is generated at the first node during a corresponding second set of comparison cycles. The comparator 104 generates a second set of control signals corresponding to the second set of voltage signals at the end of the corresponding second set of comparison cycles. The FSM successively approximates the second set of voltage signals using the second set of control signals to generate a second set of bits. The compensated first set of bits and the second set of bits together constitute the binary value of the digital signal corresponding to the $V_{IN}$.

Hence, during the successive approximation steps of the analog-to-digital conversion cycle of the SAR ADC 100, differential-nonlinearity (DNL) spikes and missing binary values are eliminated from the digital signal corresponding to the $V_{IN}$, thereby improving linearity of the digital signal corresponding to the $V_{IN}$. Moreover, the SAR ADC 100 does not require additional design changes for improving the linearity of the digital signal, thereby reducing cost and area overheads.

Figure 2A:
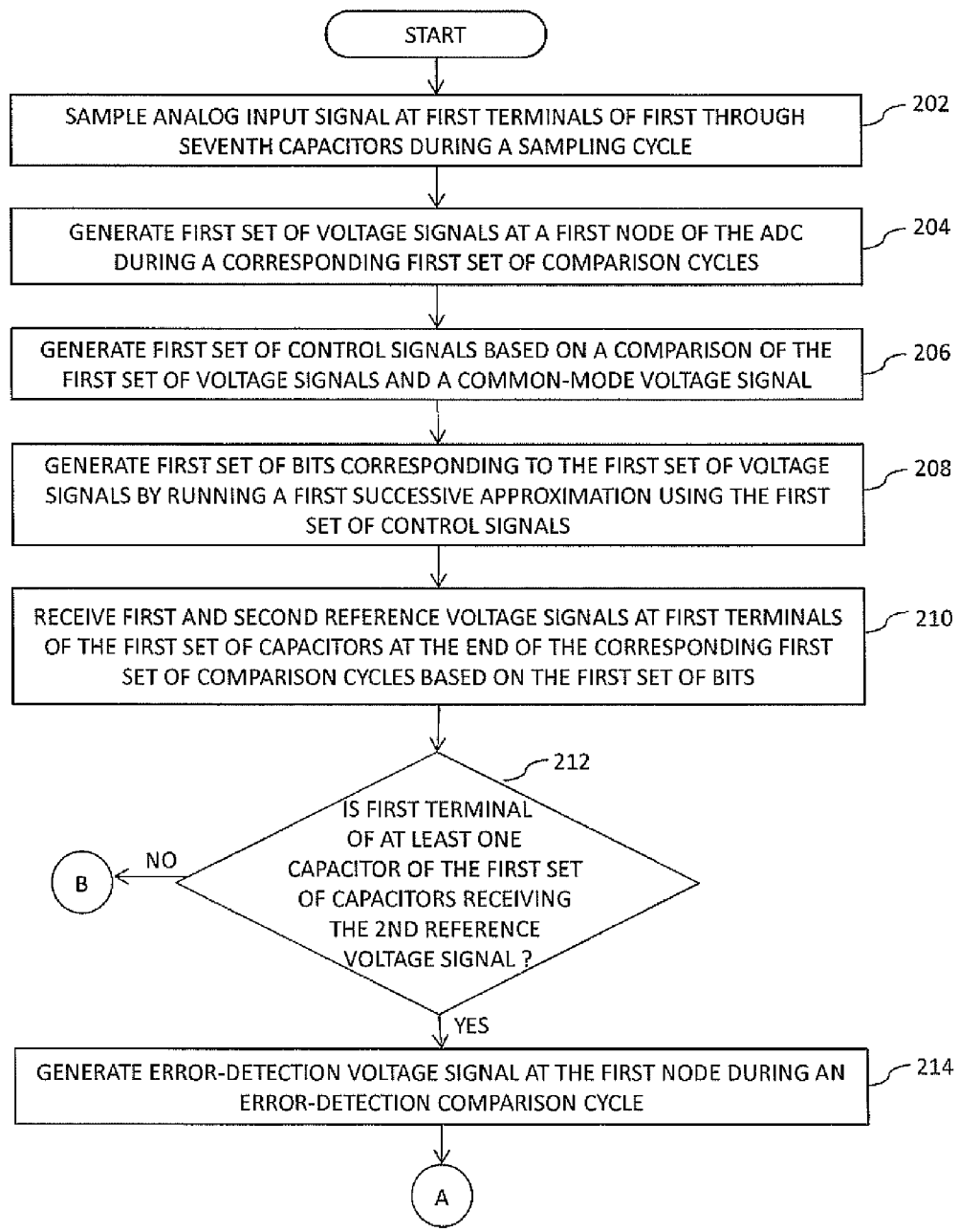
FIGS. 2A and 2B are a flow chart illustrating a method for compensating for errors during analog-to-digital data conversion by the SAR ADC of FIG. 1, in accordance with an embodiment of the present invention.
Figure 2B:
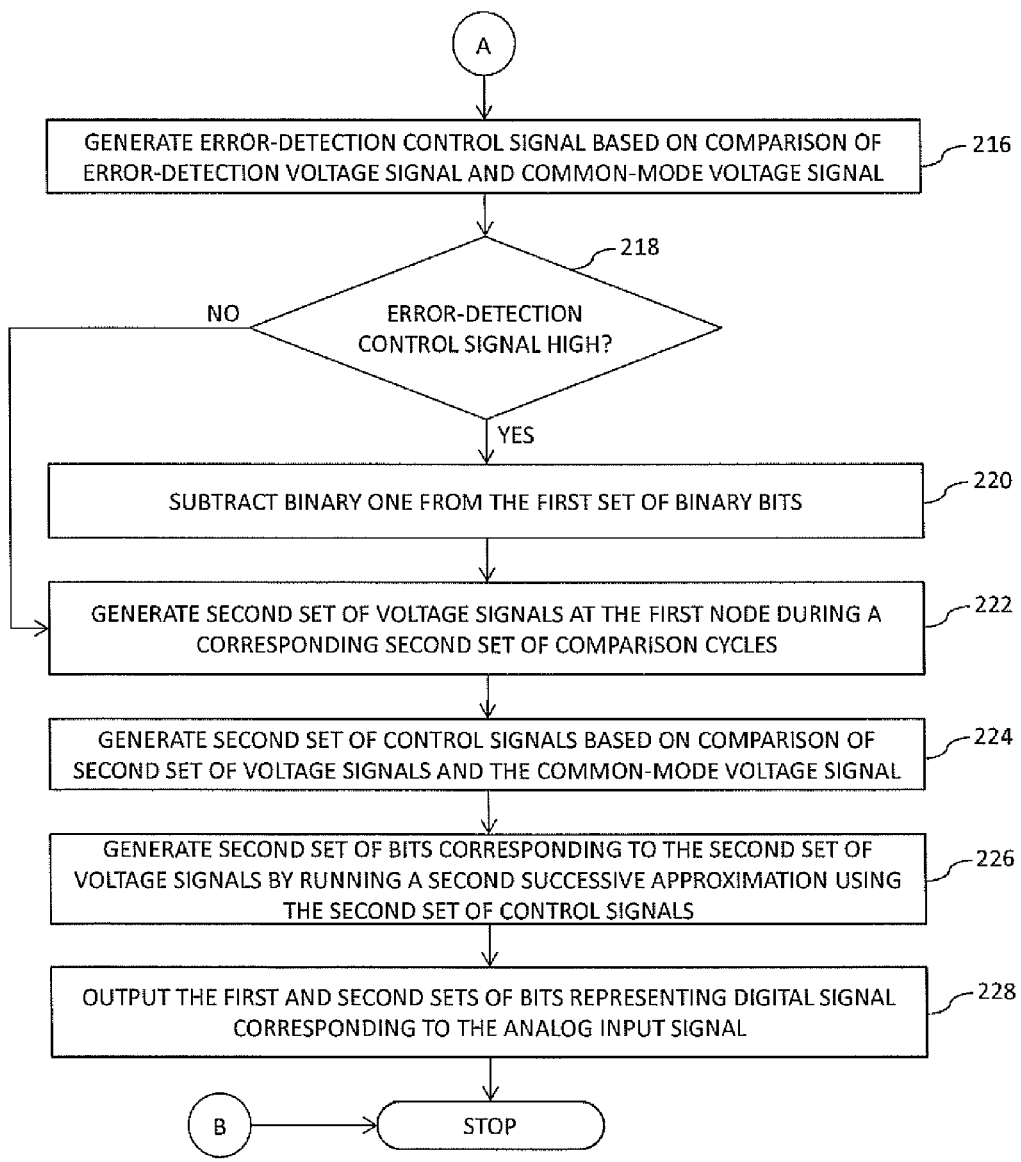

Referring now to FIGS. 2A and 2B, a flowchart illustrating a method for compensating the error during the analog-to-digital data conversion cycle of the SAR ADC 100 in accordance with an embodiment of the present invention is shown. At step 202, the first terminals of the first through seventh capacitors 108a-108g sample the $V_{IN}$ during the sampling cycle of the analog-to-digital conversion cycle of the SAR ADC 100. At step 204, the first set of capacitors (108a and 108b) generates the first set of voltage signals at the first node of the comparator 104 during the corresponding first set of comparison cycles. At step 206, the comparator 104 generates the first set of control signals corresponding to the first set of capacitors (108a and 108b) based on the comparison between the first set of voltage signals and the $V_{CM}$ at the end of corresponding first set of comparison cycles. At step 208, the FSM generates the first set of bits corresponding to the first set of voltage signals by running a first successive approximation using corresponding first set of control signals. At step 210, the first terminals of the first set of capacitors (108a and 108b) receive at least one of $V_{REFH}$ and $V_{REFL}$ based on the first set of bits. At step 212, a check is performed to determine if the first terminal of at least one capacitor of the first set of capacitors (108a and 108b) receives the $V_{REFL}$.

If at step 212, it is determined that the first terminal of at least one capacitor of the first set of capacitors (108a and 108b) does not receive the $V_{REFL}$, then the process is halted. If at step 212, it is determined that the first terminal of at least one capacitor of the first set of capacitors (108a and 108b) receives the $V_{REFL}$ then step 214 is performed. At step 214, the second terminal of the error detection capacitor 108c generates the error-detection voltage signal at the first node during the error-detection comparison cycle. At step 216, the comparator 104 generates the error-detection control signal based on the comparison between the error-detection voltage signal and the $V_{CM}$ at the end of the error-detection comparison cycle. At step 218, a check is performed to determine if the error-detection control signal is at logic high state. If at step 218 it is determined that the error-detection control signal is high, step 220 is performed. At step 220, the SAR logic circuit 106 subtracts a binary one from the first set of bits. If at step 218, the error-detection control signal is low, step 222 is performed. At step 222, the second set of capacitors 108d-108g generate the second set of voltage signals at the first node of the SAR ADC 100 during corresponding second set of comparison cycles. At step 224, the comparator 104 generates the second set of control signals corresponding to the second set of capacitors 108d-108g based on the comparison between the second set of control signals and the $V_{CM}$ at the end of the corresponding second set of comparison cycles. At step 226, the FSM of the SAR logic circuit 106 generates the second set of bits corresponding to the second set of voltage signals by running a second successive approximation using corresponding second set of control signals. At step 228, the SAR logic circuit 106 outputs the first and second sets of bits that together constitute the binary value of the digital signal corresponding to the $V_{IN}$.

While various embodiments of the present invention have been illustrated and described, it will be clear that the present invention is not limited to these embodiments only. Numerous modifications, changes, variations, substitutions, and equivalents will be apparent to those skilled in the art, without departing from the spirit and scope of the present invention, as described in the claims.

The invention claimed is:

1. An analog-to-digital converter (ADC), comprising:
a plurality of capacitors having first terminals for receiving an analog input signal during a sampling cycle of an analog-to-digital conversion cycle, and corresponding second terminals connected to a first node, wherein the plurality of capacitors comprise a first set of capacitors that generate a first set of voltage signals at the first node during a first set of comparison cycles of a plurality of comparison cycles of the analog-to-digital conversion cycle, an error-detection capacitor that generates an error-detection signal at the first node during an error-detection comparison cycle of the plurality of comparison cycles, and a second set of capacitors that generate a second set of voltage signals at the first node during a second set of comparison cycles of the plurality of comparison cycles;
a comparator having a first input terminal connected to the first node for receiving the first set of voltage signals at the end of the first set of comparison cycles, the second set of voltage signals at the end of the second set of comparison cycles, and the error-detection voltage signal at the end of the error-detection comparison cycle, a second input terminal for receiving a common-mode voltage signal, and an output terminal for outputting a first set of control signals at the end of the first set of comparison cycles, an error-detection control signal at the end of the error-detection comparison cycle, and a second set of control signals at the end of the second set of comparison cycles; and
a successive-approximation register (SAR) logic circuit, connected to the output terminal of the comparator, that generates a first set of bits corresponding to the first set of voltage signals by performing a first successive approximation using the first set of control signals, compensates for an error in the first set of bits based on the error-detection control signal, and generates a second set of bits corresponding to the second set of voltage signals by performing a second successive approximation using the second set of control signals, wherein the first and second sets of bits correspond to a binary representation of the analog input signal.

2. The ADC of claim 1, further comprising a switching circuit for receiving the analog input signal, the common-mode voltage signal, and first and second reference voltage signals.

3. The ADC of claim 2, wherein the respective first and second terminals of the plurality of capacitors are connected to the switching circuit for sampling the analog input signal and receiving the common-mode voltage signal, respectively, during the sampling cycle.

4. The ADC of claim 3, wherein the switching circuit further receives the first and second sets of bits from the SAR logic circuit at the ends of the first and second sets of comparison cycles.

5. The ADC of claim 4, wherein the first terminals of the first set of capacitors receive at least one of the first and second reference voltage signals based on the first set of bits at the end of the first set of comparison cycles.

6. The ADC of claim 5, wherein a first terminal of the error-detection capacitor receives the second reference voltage signal during the plurality of comparison cycles.

7. The ADC of claim 6, wherein the SAR logic circuit includes an AND gate that receives the first set of bits at the end of the first set of comparison cycles.

8. The ADC of claim 7, wherein the SAR logic circuit compensates for an error in the first set of bits when the AND gate output is low.

9. The ADC of claim 8, wherein the SAR logic circuit compensates for an error in the first set of bits by subtracting a binary one from the first set of bits.

10. The ADC of claim 4, wherein first terminals of the second set of capacitors receive at least one of the first and second reference voltage signals based on the second set of bits at the end of the second set of comparison cycles.

11. The ADC of claim 1, wherein the second set of comparison cycles occurs after the error-detection comparison cycle and the error-detection comparison cycle occurs after the first set of comparison cycles.

12. The ADC of claim 1, wherein a capacitance value of the error-detection capacitor is equal to a capacitance value of a capacitor of the first set of capacitors that is adjacent to the error-detection capacitor.

13. The ADC of claim 1, wherein the plurality of capacitors include binary-weighted capacitors.

14. A method for compensating for an error during an analog-to-digital conversion cycle of an analog-to-digital converter (ADC) that receives an analog input signal and generates a corresponding digital output value, wherein the ADC includes a plurality of capacitors that include first and second sets of capacitors and an error-detection capacitor, the method comprising:
    sampling the analog input signal across the plurality of capacitors during a sampling cycle of the analog-to-digital conversion cycle;
    generating a first set of voltage signals with the first set of capacitors during a first set of comparison cycles of a plurality of comparison cycles of the analog-to-digital conversion cycle;
    generating a first set of control signals based on a comparison of the first set of voltage signals and a common-mode voltage signal;
    generating a first set of bits corresponding to the first set of voltage signals by performing a first successive approximation using the first set of control signals;
    generating an error-detection voltage signal by the error-detection capacitor during an error-detection comparison cycle of the plurality of comparison cycles;
    generating an error-detection control signal based on a comparison of the error-detection voltage signal and the common-mode voltage signal;
    compensating for an error in the first set of bits based on the error-detection control signal;
    generating a second set of voltage signals with the second set of capacitors during a second set of comparison cycles of the plurality of comparison cycles;
    generating a second set of control signals based on a comparison of the second set of voltage signals and the common-mode voltage signal; and
    generating a second set of bits corresponding to the second set of voltage signals by performing a second successive approximation using the second set of control signals, wherein the first and second sets of bits correspond to the digital output value.

15. The method of claim 14, further comprising receiving the analog input signal and the common-mode voltage signal at first and second terminals of the plurality of capacitors, respectively, during the sampling cycle.

16. The method of claim 15, further comprising receiving at least one of first and second reference voltage signals at the first terminals of the first set of capacitors based on the first set of bits at the end of the first set of comparison cycles, and receiving at least one of the first and second reference voltage signals at the first terminals of the second set of capacitors based on the second set of bits at the end of the second set of comparison cycles.

17. The method of claim 16, further comprising receiving the second reference voltage signal at the first terminal of the error-detection capacitor during the plurality of comparison cycles.

18. The method of claim 17, further comprising compensating for the error in the first set of bits when the first terminal of at least one capacitor of the first set of capacitors receives the second reference voltage signal.

19. The method of claim 18, further comprising compensating for the error in the first set of bits by subtracting a binary one from the first set of bits.

20. An analog-to-digital converter (ADC), comprising:
    a plurality of capacitors having respective first terminals for receiving an analog input signal during a sampling cycle of an analog-to-digital conversion cycle, and respective second terminals connected together at a first node, wherein the plurality of capacitors comprise a first set of capacitors that generate a first set of voltage signals at the first node during a first set of comparison cycles of a plurality of comparison cycles of the analog-to-digital conversion cycle, an error-detection capacitor that generates an error-detection voltage signal at the first node during an error-detection comparison cycle of the plurality of comparison cycles, and a second set of capacitors that generate a second set of voltage signals at the first node during a second set of comparison cycles of the plurality of comparison cycles;
    a comparator having a first input terminal connected to the first node for receiving the first set of voltage signals at the end of corresponding first set of comparison cycles, the second set of voltage signals at the end of corresponding second set of comparison cycles, and the error-detection voltage signal at the end of the error-detection comparison cycle, a second input terminal for receiving a common-mode voltage signal, and an output terminal for outputting a first set of control signals at the end of corresponding first set of comparison cycles, an error-detection control signal at the end of the error-detection comparison cycle, and a second set of control signals at the end of corresponding second set of comparison cycles;

a successive-approximation register (SAR) logic circuit, connected to the output terminal of the comparator, that generates a first set of bits corresponding to the first set of voltage signals by running a first successive approximation using the first set of control signals, compensates an error in the first set of bits based on the error-detection control signal, and generates a second set of bits corresponding to the second set of voltage signals by running a second successive approximation using the second set of control signals, wherein the first and second sets of bits correspond to a binary representation of the analog input signal; and an AND gate, connected to the SAR logic circuit, for receiving the first set of bits and generating a first logic signal, wherein the SAR logic circuit compensates the error in the first set of bits based on the first logic signal.

* * * * *